(12) United States Patent
Chen et al.

(10) Patent No.: US 7,586,312 B2
(45) Date of Patent: Sep. 8, 2009

(54) POWER CYCLE TEST METHOD FOR TESTING AN ELECTRONIC EQUIPMENT

(75) Inventors: Shin-Hui Chen, Taipei Hsien (TW);
Chien-Hung Lo, Taipei Hsien (TW);
Xiang Cao, Shenzhen (CN);
Zheng-Quan Peng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 140 days.

(21) Appl. No.: 11/933,443

(22) Filed: Nov. 1, 2007

(65) Prior Publication Data
US 2008/0164883 A1    Jul. 10, 2008

(30) Foreign Application Priority Data
Dec. 1, 2006    (TW)    ............... 95144676 A

(51) Int. Cl.
*G01R 31/08*    (2006.01)
*G21C 17/00*    (2006.01)

(52) U.S. Cl. ....................... 324/527; 702/183

(58) Field of Classification Search ................ 324/511, 324/500, 523, 527, 763, 765, 71.1, 76.11, 324/158.1; 702/1, 108, 118, 123, 127, 182, 702/183
See application file for complete search history.

(56) References Cited

U.S. PATENT DOCUMENTS

| 4,140,965 | A | * | 2/1979 | Neal ........................... 324/551 |
| 6,038,181 | A | * | 3/2000 | Braceras et al. ............. 365/201 |
| 6,958,922 | B2 | | 10/2005 | Kazem |
| 7,504,801 | B2 | * | 3/2009 | Comery ....................... 320/107 |

* cited by examiner

*Primary Examiner*—Timothy J Dole
*Assistant Examiner*—Hoai-An D Nguyen
(74) *Attorney, Agent, or Firm*—Frank R. Niranjan

(57) ABSTRACT

A power cycle test method for testing an electronic equipment (30) includes: configuring a total test count and a current test count; updating the current test count by incrementing the current test count by a value; utilizing a corresponding AC control signal, a corresponding DC control signal, and a reboot control signal to control the electronic equipment in sequence; checking whether the electronic equipment is in a workable condition when the electronic equipment is respectively controlled under the control signals; repeating the updating step, the utilizing step and the checking step until the current test count is equal to the total test count; and generating a result message if the current test count is equal to the total test count. A related system is also disclosed.

14 Claims, 2 Drawing Sheets

POWER CYCLE TEST METHOD FOR TESTING AN ELECTRONIC EQUIPMENT

BACKGROUND OF THE INVENTION

1. Field of the Invention

The present invention generally relates to power test methods for testing electronic equipments, and more particularly to a power cycle test method for testing an electronic equipment.

2. Description of Related Art

An electronic equipment, such as a personal computer, a notebook computer, or a server, must be tested on performance before the electronic equipment is distributed into the consumer market. In order to control and improve the performance of the electronic equipment, one or more power cycle tests should be performed to test the electronic equipment.

Once electronic equipments use alternating current (AC) power supplies and the working current of the electronic equipments is direct current (DC), the AC supplied by the AC power supplies must be transformed into DC so that the electronic equipments can be powered, and each of the one or more power cycle tests includes an AC test, a DC test, and a reboot test.

However, presently, the one or more power cycle tests must be performed individually, and a lot of manual work are required during each power cycle test. That is, the efficiency and correctness of each power cycle test are never ensured.

What is needed, therefore, is a power cycle test method that can automatically test an electronic equipment, and that can exactly and effectively test an electronic equipment.

SUMMARY OF THE INVENTION

A power cycle test method for testing an electronic equipment in accordance with a preferred embodiment includes the steps of: providing a hardware configuration consisting of a host computer, a single chip processor, a relay, and a power supply; predefining a total test count, and resetting a current test count; updating the current test count by incrementing the current test count by a value; checking whether the electronic equipment passes an alternating current (AC) test under a first AC control signal, the first AC control signal being transmitted to the single chip processor; powering off the electronic equipment under a first direct current (DC) control signal if the electronic equipment passes the AC test, the first DC control signal being transmitted to the single chip processor; checking whether the electronic equipment passes a DC test under a second DC control signal, the second DC control signal being transmitted to the single chip processor; checking whether the electronic equipment passes a reboot test under a reboot control signal if the electronic equipment passes the DC test, the reboot control signal being transmitted to the single chip processor; powering off the electronic equipment under a second AC control signal if the electronic equipment passes the reboot test, the second AC control signal being transmitted to the single chip processor; determining whether the current test count is equal to the total test count; and displaying a result message if the current test count is equal to the total test count.

A power cycle test method for testing an electronic equipment in accordance with a preferred embodiment includes the steps of: configuring a total test count and a current test count; updating the current test count by incrementing the current test count by a value; utilizing a corresponding AC control signal, a corresponding DC control signal, and a reboot control signal to control the electronic equipment in sequence; checking whether the electronic equipment is in a workable condition when the electronic equipment is respectively controlled under said control signals; repeating said updating step, said utilizing step and said checking step until the current test count is equal to the total test count; and generating a result message if the current test count is equal to the total test count.

Other advantages and novel features of the present invention will become more apparent from the following detailed description of preferred embodiments when taken in conjunction with the accompanying drawings.

DETAILED DESCRIPTION OF THE INVENTION

Figure 1:
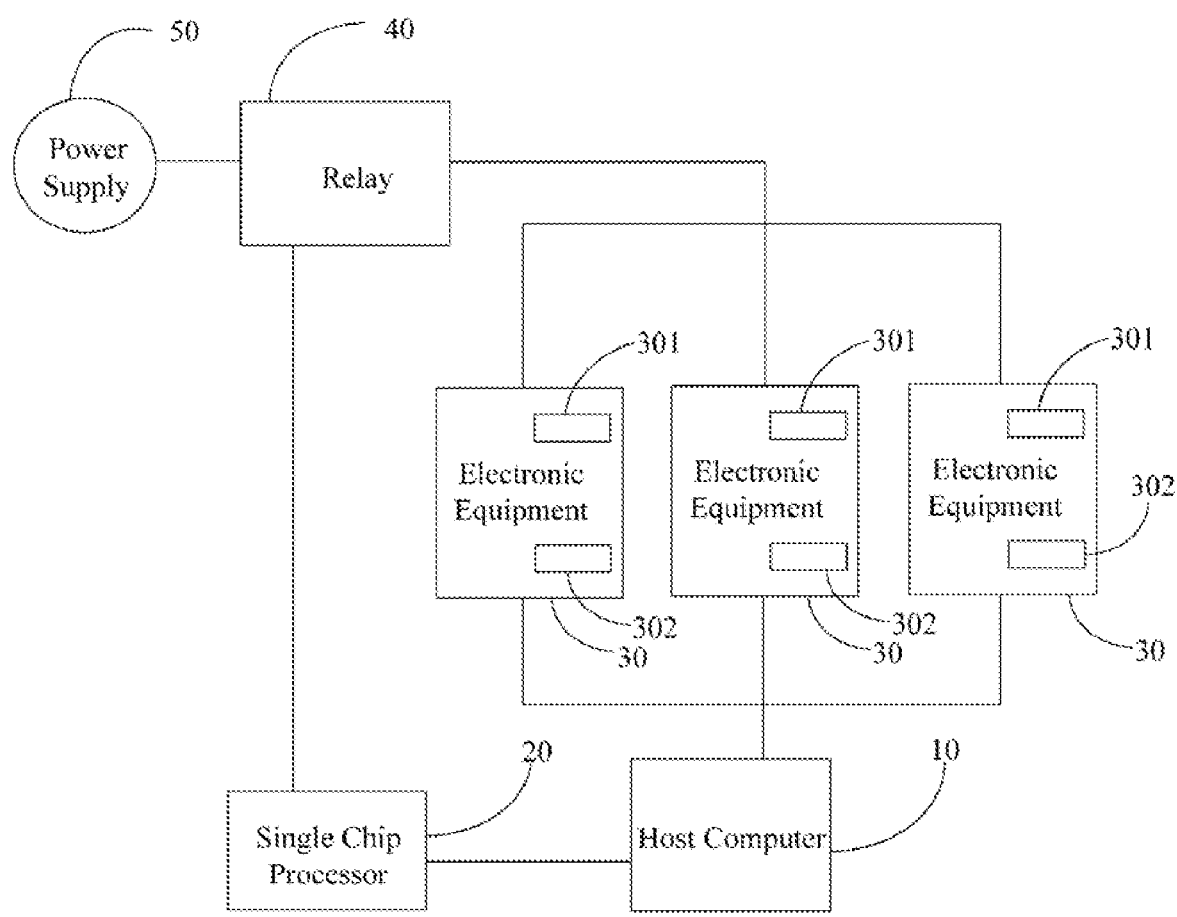
FIG. 1 is a schematic diagram of a hardware configuration of a power cycle test method for testing an electronic equipment in accordance with a preferred embodiment.

FIG. 1 is a schematic diagram of a hardware configuration of a power cycle test method for testing one or more electronic equipments in accordance with a preferred embodiment. The hardware configuration includes a host computer 10, a single chip processor 20, one or more electronic equipments 30 (only three shown in FIG. 1), a relay 40, and a power supply 50. The host computer 10 is connected with the single chip processor 20, and connected with the electronic equipments 30. The relay 40 is connected with the single chip processor 20. The power supply 50 is connected with the electronic equipments 30 through the relay 40. Each electronic equipment 30 has a power switch 301, and a reboot switch 302. The electronic equipments 30 are selected from the group consisting of a personal computer (PC), a notebook computer, a server, and a television.

The host computer 10 is configured (structured and arranged) for performing power cycle tests on the electronic equipments 30 by employing each part of the hardware configuration. Each of The power cycle tests include an alternating current (AC) test, a direct current (DC) test, and a reboot test. The AC test is used for testing performance of each of the electronic equipments 30 when AC is suddenly supplied to or discontinued from the electronic equipments 30 correspondingly. The DC test is used for testing performance of each of the electronic equipments 30 when DC is suddenly supplied to or discontinued from the electronic equipments 30 correspondingly. The reboot test is used for testing performance of each of the electronic equipments 30 when the electronic equipments 30 are rebooted.

The single chip processor 20 is a microcontroller unit (MCU), and is configured for receiving control signals that are transmitted from the host computer 10. The control signals include AC control signals, DC control signals, and a reboot control signal. The single chip processor 20 is further configured for enabling/disabling the relay 40 according to the AC control signals, thereby powering on/powering off the electronic equipments 30, for actuating/activating the power switch 301 of each of the electronic equipments 30 according to the DC control signals, thereby powering on/powering off (turning on/turning off) the electronic equipments 30, and for actuating the reboot switch 302 of each of the electronic equipments 30 according to the reboot control signal.

The power supply 50 is configured for supplying power to the electronic equipments 30. In the preferred embodiment, the power supply 50 is an AC power supply, and the value of the voltage value supplied by the power supply 50 falls into a predetermined range between 200 volt and 240 volt. At the beginning of each of the power cycle tests, the relay 40 is disabled, and the power switch 301 of each of the electronic equipments 30 is actuated to power on the electronic equipments 30.

The power switch 301 of a corresponding electronic equipment 30 is used as a controller, and is configured for controlling the corresponding electronic equipment 30 to be supplied with/discontinued from DC. The DC is transformed from the AC supplied by the power supply 50. The reboot switch 302 of the corresponding electronic equipment 30 is configured for performing the reboot test on the corresponding electronic equipment 30.

The relay 40 is used to control (create/interrupt) connections between the electronic equipments 30 and the power supply 50. That is, the relay 40 creates the connections between the electronic equipments 30 and the power supply 50 if the relay 40 is enabled and vice versa.

Figure 2:
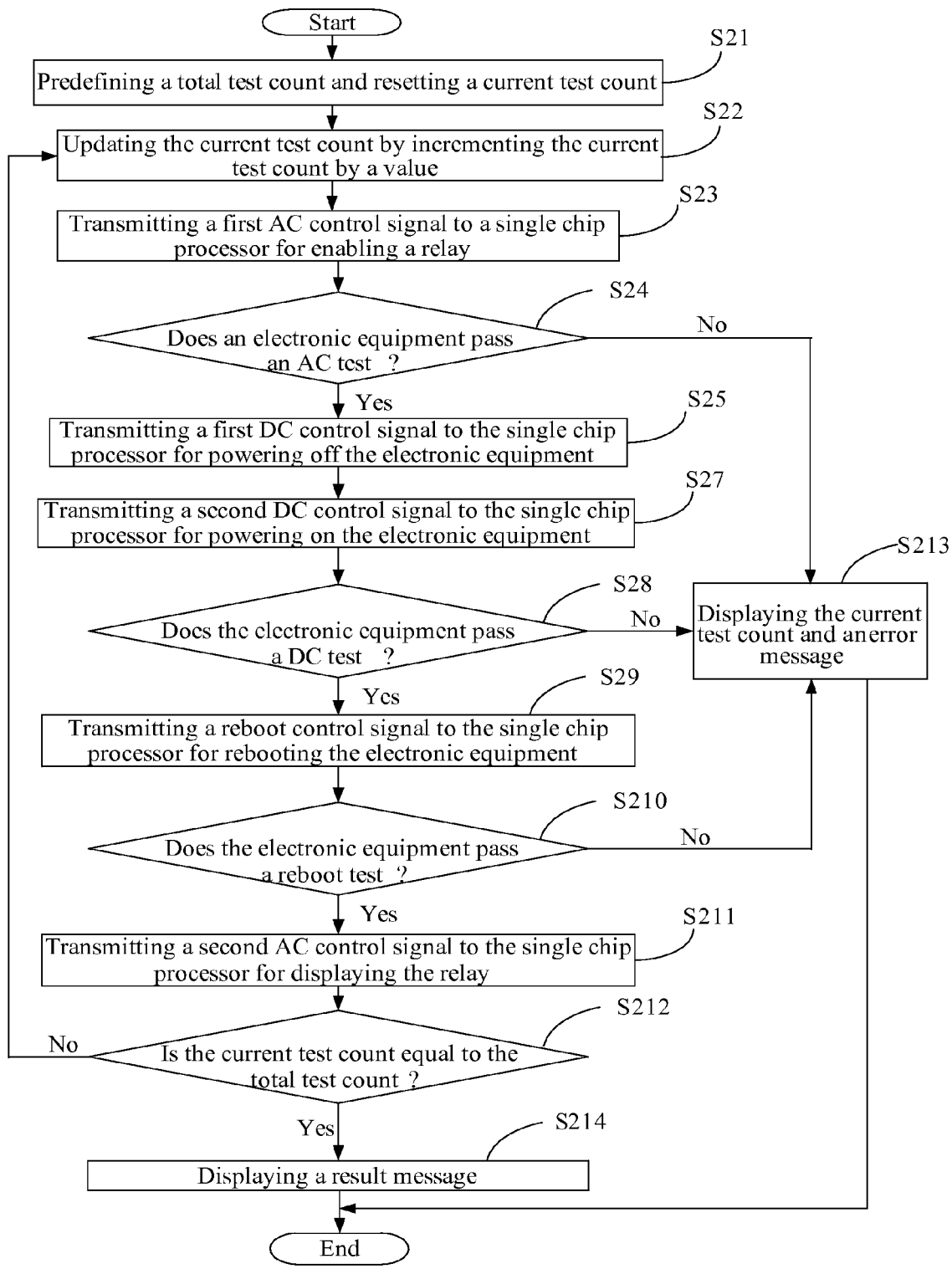
FIG. 2 is a flowchart of a power cycle test method for testing an electronic equipment in accordance with a preferred embodiment.

FIG. 2 is a flowchart of the power cycle test method for testing one or more electronic equipments 30 in accordance with the preferred embodiment. At the beginning of each of the power cycle tests, the relay 40 is disabled, and the power switch 301 of each of the electronic equipments 30 is actuated to power on the electronic equipments 30.

In step S21, a total test count "n" (e.g. 500) is manually inputted to initialize a total of the power cycle tests to be performed by utilizing the host computer 10. The host computer 10 further resets a current test count "M" to "0".

In step S22, the host computer 10 updates the current test count "M" by incrementing the current test count "M" by "1".

In step S23, the host computer 10 performs the AC test. In detail, the host computer 10 transmits a first AC control signal to the single chip processor 20 to enable the relay 40. The single chip processor 20 receives the first AC control signal and then enables the relay 40 according to the first AC control signal. Once the relay 40 is enabled, the electronic equipments 30 are suddenly supplied with the AC.

In step S24, the host computer 10 detects test results from the electronic equipments 30. In the preferred embodiment, each of the test results is a bootup success message from each of the electronic equipments 30. The host computer 10 determines whether all the electronic equipments 30 pass the AC test by detecting if the test results from all the electronic equipments 30 have been received.

If all the electronic equipments 30 pass the AC test, in step S25, the host computer 10 performs the DC test. In detail, the host computer 10 transmits a first DC control signal for actuating the power switch 301 of each of the electronic equipments 30 to the single chip processor 20. The first DC control signal is used to power off the electronic equipments 30. The single chip processor 20 receives the first DC control signal, and actuates the power switch 301 of each of the electronic equipments 30 according to the first DC control signal thereby powering off the electronic equipments 30. Thus, the DC supplied to the electronic equipments 30 is suddenly discontinued.

If any of the electronic equipments 30 does not pass the AC test, in step S213, the host computer 10 displays an error message, the current test count "M", and a name of a current test. In the preferred embodiment, the error message indicates that one of the electronic equipments 30 is an unqualified product. The name of the current test can be "AC test," "DC test," or "reboot test" if the current test is the AC test, the DC test, or the reboot test respectively.

In step S27, the host computer 10 transmits a second DC control signal for actuating the power switch 301 of each of the electronic equipments 30 to the single chip processor 20. The second DC control signal is used to power on the electronic equipments 30. The single chip processor 20 receives the second DC control signal, and actuates the power switch 301 of each of the electronic equipments 30 according to the second DC control signal thereby powering on the electronic equipments 30. Then, the DC to power on the electronic equipments 30 is suddenly supplied.

In step S28, the host computer 10 detects the test results from the electronic equipments 30. The host computer 10 determines whether all the electronic equipments 30 pass the DC test by detecting if the test results from all the electronic equipments 30 have been received.

If all the electronic equipments 30 pass the DC test, in step S29, the host computer 10 performs the reboot test. In detail, the host computer 10 transmits the reboot control signal for actuating the reboot switch 302 of each of the electronic equipments 30 to the single chip processor 20. The single chip processor 20 receives the reboot control signal, and actuates the reboot switch 302 of each of the electronic equipments 30 according to the reboot control signal. Then, the electronic equipments 30 are rebooted.

If any of the electronic equipments 30 does not pass the DC test, the procedure goes directly to step S213 described above.

In step S210, the host computer 10 detects the test results from the electronic equipments 30. The host computer 10 determines whether all the electronic equipments 30 pass the reboot test by detecting if the test results from all the electronic equipments 30 have been received.

If all the electronic equipments 30 pass the reboot test, in step S211, the host computer 10 transmits a second AC control signal to the single chip processor 20 to disable the relay 40. The single chip processor 20 receives the second AC control signal and then disables the relay 40 according to the second AC control signal. Once the relay 40 is disabled, the electronic equipments 30 are suddenly discontinued with the AC.

If any of the electronic equipments 30 does not pass the reboot test, the procedure goes directly to step S213 described above.

In step S212, the host computer 10 determines whether the current test count "M" is equal to the total test count "n".

If the current test count "M" is equal to the total test count "n", in step S214, the host computer 10 displays a result message that indicates all the electronic equipments 30 are qualified products, and the procedure ends.

If the current test count "M" does not equal to the total test count "n", the procedure returns directly to step S22 described above.

It should be emphasized that the above-described embodiments of the preferred embodiments, particularly, any "preferred" embodiments, are merely possible examples of implementations, merely set forth for a clear understanding of the principles of the invention. Many variations and modifications may be made to the above-described preferred embodiment(s) without departing substantially from the spirit and principles of the invention. All such modifications and variations are intended to be included herein within the scope of this disclosure and the above-described preferred embodiment(s) and protected by the following claims.

What is claimed is:

1. A power cycle test method for testing an electronic equipment, the method comprising:

providing a hardware configuration consisting of a host computer, a single chip processor, a relay, and a power supply;

predefining a total test count, and resetting a current test count;

updating the current test count by incrementing the current test count by a value;

checking whether the electronic equipment passes an alternating current (AC) test under a first AC control signal, the first AC control signal being transmitted to the single chip processor;

powering off the electronic equipment under a first direct current (DC) control signal if the electronic equipment passes the AC test, the first DC control signal being transmitted to the single chip processor;

checking whether the electronic equipment passes a DC test under a second DC control signal, the second DC control signal being transmitted to the single chip processor;

checking whether the electronic equipment passes a reboot test under a reboot control signal if the electronic equipment passes the DC test, the reboot control signal being transmitted to the single chip processor;

powering off the electronic equipment under a second AC control signal if the electronic equipment passes the reboot test, the second AC control signal being transmitted to the single chip processor;

determining whether the current test count is equal to the total test count; and displaying a result message if the current test count is equal to the total test count.

2. The method as claimed in claim 1, wherein said AC control signals are used for enabling/disabling the relay to correspondingly power on/power off the electronic equipment.

3. The method as claimed in claim 1, wherein said DC control signals are used for actuating/activating a power switch of the electronic equipment to correspondingly power on/power off the electronic equipment.

4. The method as claimed in claim 1, wherein the reboot control signal is used for actuating a reboot switch of the electronic equipment to reboot the electronic equipment.

5. The method as claimed in claim 1, wherein each of said checking steps is achieved by checking whether a test result is received.

6. The method as claimed in claim 5, wherein the test result is a bootup success message of the electronic equipment.

7. The method as claimed in claim 1, further comprising the steps of:
displaying the current test count and an error message that indicates the electronic equipment is an unqualified product, if the electronic equipment does not pass the AC test, the DC test, or the reboot test.

8. The method as claimed in claim 1, further comprising the steps of:
returning to the step of updating the current test count by incrementing the current test count by a value, if the current test count does not equal to the total test count.

9. The method as claimed in claim 1, wherein the power supply is an AC power supply.

10. The method as claimed in claim 1, wherein the single chip processor is a microcontroller unit (MCU).

11. The method as claimed in claim 1, wherein the electronic equipment is selected form a group consisting of a personal computer, a notebook computer, a server, and a television.

12. A power cycle test method for testing an electronic equipment, the method comprising:
configuring a total test count and a current test count;
updating the current test count by incrementing the current test count by a value;
utilizing a corresponding AC control signal, a corresponding DC control signal, and a reboot control signal to control the electronic equipment in sequence;
checking whether the electronic equipment is in a workable condition when the electronic equipment is respectively controlled under said control signals;
repeating said updating step, said utilizing step and said checking step until the current test count is equal to the total test count; and
generating a result message if the current test count is equal to the total test count.

13. The method as claimed in claim 12, wherein said creating step, utilizing step, checking step, and generating step are executed by a hardware configuration consisting of a host computer, a single chip processor, a relay, and a power supply.

14. The method as claimed in claim 12, wherein the result message indicates the electronic equipment is a qualified product.

* * * * *